United States Patent
Koo et al.

(10) Patent No.: US 7,285,902 B2
(45) Date of Patent: Oct. 23, 2007

(54) FLAT PANEL DISPLAY WITH IMPROVED WHITE BALANCE

(75) Inventors: Jae-Bon Koo, Yongin (KR); Sang-Il Park, Seoul (KR); Ul-Ho Lee, Yongin (KR); Jin-Soo Kim, Yongin (KR); Jin-Woung Jung, Suwon (KR); Chang-Gyu Lee, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 227 days.

(21) Appl. No.: 10/815,792

(22) Filed: Apr. 2, 2004

(65) Prior Publication Data
US 2004/0207583 A1 Oct. 21, 2004

(30) Foreign Application Priority Data
Apr. 17, 2003 (KR) ............... 10-2003-0024425
Apr. 17, 2003 (KR) ............... 10-2003-0024447

(51) Int. Cl.
*H01J 1/62* (2006.01)
*H01J 63/04* (2006.01)

(52) U.S. Cl. .................. 313/500; 313/498

(58) Field of Classification Search ........... 313/500
See application file for complete search history.

(56) References Cited

U.S. PATENT DOCUMENTS 5,204,659 A * 4/1993 Sarma .................... 345/89
7,002,302 B2 * 2/2006 Park et al. ............... 315/169.3

FOREIGN PATENT DOCUMENTS

JP 2001-109399 4/2001
JP 2001-290441 10/2001

* cited by examiner

*Primary Examiner*—Joseph Williams
*Assistant Examiner*—Bumsuk Won
(74) *Attorney, Agent, or Firm*—H.C. Park & Associates, PLC

(57) ABSTRACT

Disclosed is a flat panel display capable of enhancing a white balance by making a doping concentration or shape and size of drain offset regions of driving transistors different, in R, G and B unit pixels of each pixel. A flat panel display, comprises a plurality of pixels, where each of pixels including R, G and B unit pixels to embody red (R), green (G) and blue (B) colors, respectively. Each of the unit pixels includes a transistor with source/drain regions. Transistors of at least two unit pixels of the R, G and B unit pixels have drain regions of different geometric structures. In each unit pixel, a resistance value of the drain region of the transistor to drive a light-emitting device having the highest luminous efficiency among the transistors is higher than that of the drain region of a transistor to drive the light-emitting device having a relatively low luminous efficiency.

15 Claims, 13 Drawing Sheets

FLAT PANEL DISPLAY WITH IMPROVED WHITE BALANCE

CROSS-REFERENCE TO RELATED APPLICATION

This application claims the benefit of Korean Patent Application No. 2003-24425 and 2003-24447, filed Apr. 17, 2003, the disclosure of which is incorporated herein by reference in its entirety.

FIELD OF THE INVENTION

The present invention is related to a full-color flat panel display and, more particularly, to a flat panel display capable of embodying a white balance by changing a doping concentration or shape and size of an offset in a drain region and then varying a resistance value of the drain region in each unit pixel.

BACKGROUND OF THE INVENTION

Generally, as shown in FIG. 1, an organic light emitting diode (OLED) being a flat panel display includes a number of pixels 100 which are arranged in the form of a matrix, each pixel 100 comprising three unit pixels, that is, a unit pixel 110R for embodying a red color (R), a unit pixel 120G for embodying a green color (G) and a unit pixel 130B for embodying a blue color (B).

The R unit pixel 110R includes a red electroluminescence ("EL") device 115 including a red (R) light emitting layer, a driving transistor 113 for supplying a current to the red EL device 115, and a switching transistor 111 for switching the current supply from the driving transistor 113 to the red EL device 115.

The G unit pixel 120G includes a green EL device 125 including a green (G) light emitting layer, a driving transistor 123 for supplying a current to the green EL device 125, and a switching transistor 121 for switching the current supply from the driving transistor 123 to the green EL device 125.

The B unit pixel 130B includes a blue EL device 135 including a blue (B) light emitting layer, a driving transistor 133 for supplying a current to the blue EL device 135, and a switching transistor 131 for switching the current supply from the driving transistor 133 to the blue EL device 135.

Conventionally, the driving transistors 113, 123 and 133 of the R, G and B unit pixels 110R, 120G and 130B of an OLED have the same size, that is, the ratio W/L of the width W to the length L of the channel layer, and the order of the EL devices in the order of their luminous efficiencies is B, R and G unit pixel, where the B unit pixel has the lowest luminous efficiencies. Since the sizes of the driving transistors 113, 123 and 133 of the R, G, and B unit pixels 110R, 120G and 130B are same while luminous efficiencies of each R, G and B EL layer 115, 125 and 135 are different with one another, it was difficult to embody the white balance.

In order to embody the white balance, a relatively small quantity of current should be supplied to the EL device having high luminous efficiency, for example, green EL device, and a relatively large quantity of current should be supplied to the red and blue EL devices having low luminous efficiencies.

Here, since a current Id flowing to the EL device through the driving transistor begins to flow when the driving transistor is in the saturation state, the current is expressed as follows.

$$Id = \text{Cox}\, \mu W\{(Vg-Vth)\}^2/2L \qquad (1)$$

Therefore, one of the methods for controlling the current flowing to the EL device in order to embody the white balance is to make the sizes of the driving transistors of the R, G and B unit pixels, that is, the ratio W/L of the width W to the length L of the channel layer, different and then to control a quantity of the current flowing to the EL devices of the R, G and B unit pixels. A method for controlling the quantity of current flowing to the EL device in accordance with the size of the transistor is disclosed in the Japanese Laid-open Publication No. 2001-109399. In the Japanese patent, the sizes of the driving transistors of the R, G and B unit pixels are differently formed in accordance with the luminous efficiency of the EL device in each R, G and B unit pixel. That is, the quantity of the current flowing to the EL device of the R, G and B unit pixels is controlled by making the size of the driving transistor of the green unit pixel having a high luminous efficiency smaller than those of the driving transistors of the red or blue unit pixels having relatively low luminous efficiencies.

Another method to embody the white balance is to make the dimensions of the light emitting layers of R, G and B unit pixels different, which is disclosed in the Japanese Laid-open Patent Publication No. 2001-290441. In this Japanese patent, the same luminance is generated from the R, G and B unit pixels by making the light emitting areas different in accordance with light emitting efficiencies of the EL devices of the R, G and B unit pixels. That is, the same luminance is generated from the R, G and B unit pixels by making the light emitting areas of the R unit pixel or the B unit pixel having lower luminous efficiencies relatively larger than the light emitting areas of the G unit pixel having a relatively high luminous efficiency.

However, in the conventional method for embodying the white balance described above, since the light emitting area of the unit pixel having low luminous efficiency among the R, G and B unit pixels is enlarged, or the size of the transistor of the unit pixel having low luminous efficiency among the R, G and B unit pixels is increased, the area occupied in each pixel is increased, and therefore it is not easy to apply the method to a high definition flat panel display (FPD).

SUMMARY OF THE INVENTION

It is an aspect of the present invention to provide a flat panel display wherein a white balance can be embodied without increasing the area of a pixel.

A further aspect of the present invention provides a flat panel display wherein a white balance can be embodied by making resistance values of drain areas of driving transistors in each R, G and B unit pixel different.

It is yet another aspect of the present invention to provide a flat panel display wherein a white balance can be embodied by making doping concentrations of drain offset regions of driving transistors in each R, G and B unit pixel different.

Another aspect of the present invention provides a flat panel display wherein a white balance can be embodied by making geometric structures of drain regions of driving transistors in each R, G and B unit pixel different and changing resistance values of the drain regions.

An additional aspect of the present invention provides a flat panel display wherein a white balance can be embodied by making shapes and sizes of drain offset regions of driving transistors in each R, G and B unit pixel different.

According to an exemplary of embodiment of the present invention, there is provided a flat panel display, comprising a plurality of pixels, each of the pixels including R, G and B unit pixels to embody red (R), green (G) and blue (B) colors, respectively. Each of the unit pixels includes a transistor with source/drain regions, wherein the transistors of at least two unit pixels of the R, G and B unit pixels having drain regions of different geometric structures.

The unit pixels have different geometric structures which further include light-emitting devices, respectively, and channel layers of the transistors controlling currents supplied to the light emitting devices of the unit pixels are of the same size. A resistance value of a drain region of a transistor to drive a light emitting device having the highest luminous efficiency of the light emitting devices among the transistors in the unit pixels is higher than the resistance value of drain regions of transistors to drive light emitting devices having low luminous efficiency relatively.

The drain regions of the transistors of the R, G and B unit pixels are of a construction having the same length and different widths with one another, or a construction having the same width and different lengths with one another. The drain regions may have zigzag shapes.

The R, G and B unit pixels further include respective light emitting devices driven by the transistor. A drain region of a transistor to drive a light emitting device having the highest luminous efficiency of the light emitting devices among the transistors in the unit pixels has longer length or a narrower width compared with the lengths and widths of drain regions of transistors to drive light emitting devices having the relatively lower luminous efficiency.

The drain regions of the transistors of the R, G and B unit pixels include offset regions having different geometric structures from one another. The unit pixels further include respective light emitting devices driven by the transistors, and a drain offset region of a transistor to drive a light emitting device having the highest luminous efficiency among the transistors in the unit pixels has a longer length or a narrower width in comparison with the lengths and widths of drain offset regions of transistors to drive light emitting devices having relatively low luminous efficiency.

The drain offset regions of the transistors of the R, G and B unit pixels are of a construction having the same length and different widths from one another, or a construction having the same width and different lengths from one another. The drain offset regions may have zigzag shapes.

Another exemplary embodiment of the present invention provides a flat panel display, comprising a plurality of pixels, each of the pixels including R, G and B unit pixels to embody red (R), green (G) and blue (B) colors, respectively, and each of the unit pixels including a transistor with source/drain regions, wherein transistors of at least two unit pixels of the R, G and B unit pixels having drain regions of different resistance values.

The unit pixels having different resistance values further include light-emitting devices, respectively, and channel layers of the transistors controlling currents supplied to the light emitting devices of each unit pixel are of same size. A resistance value of a drain region of a transistor to drive a light emitting device having the highest luminous efficiency among the transistors in the unit pixels is larger than the resistance value of drain regions of transistors to drive light emitting devices having a relatively low luminous efficiency.

The drain regions of the R, G and B unit pixels include offset regions having different doping concentrations. The unit pixels further include light emitting devices driven by the transistors, respectively, and a drain offset region of a transistor to drive a light emitting device having the highest luminous efficiency among the transistors in the unit pixels has a doping concentration lower than those of drain offset regions of transistors to drive light emitting devices having a relatively low luminous efficiency.

The R, G and B unit pixels further include light emitting devices driven by the transistors, respectively, and the source/drain regions of the transistors include respective offset regions. Source offset regions of the transistors of the R, G and B unit pixels comprise non-doped regions, and drain offset regions of the transistors have different impurity doping concentrations in accordance with luminous efficiencies of the light emitting devices.

The R, G and B unit pixels further include light emitting devices driven by the transistors, respectively, and the source/drain regions of the transistors include respective offset regions. Source offset regions of the transistors of the R, G and B unit pixels comprise regions doped with the same impurity concentration, and drain offset regions of the transistors have different impurity doping concentrations in accordance with the luminous efficiencies of the light emitting devices.

The R, G and B unit pixels further include light emitting devices driven by the transistors, respectively, where the source/drain regions of the transistors include respective offset regions, and source/drain offset regions of the transistors of the R, G and B unit pixels have different impurity concentrations in accordance with luminous efficiencies of the light emitting devices.

The R, G and B unit pixels further include light emitting devices driven by the transistors, respectively, and at least two transistors of the transistors in the R, G and B unit pixels include offset regions which are doped with impurities having different doping concentrations. A drain offset region of a transistor to drive a light emitting device having the higher luminous efficiency in the at least two transistors has the doping concentration lower than that of a drain offset region of the other transistor.

BRIEF DESCRIPTION OF THE DRAWINGS

The above and other features and advantages of the present invention will become more apparent to those of ordinary skill in the art by describing in detail embodiments thereof with reference to the attached drawings.

DETAILED DESCRIPTION OF THE INVENTION

Figure 1:
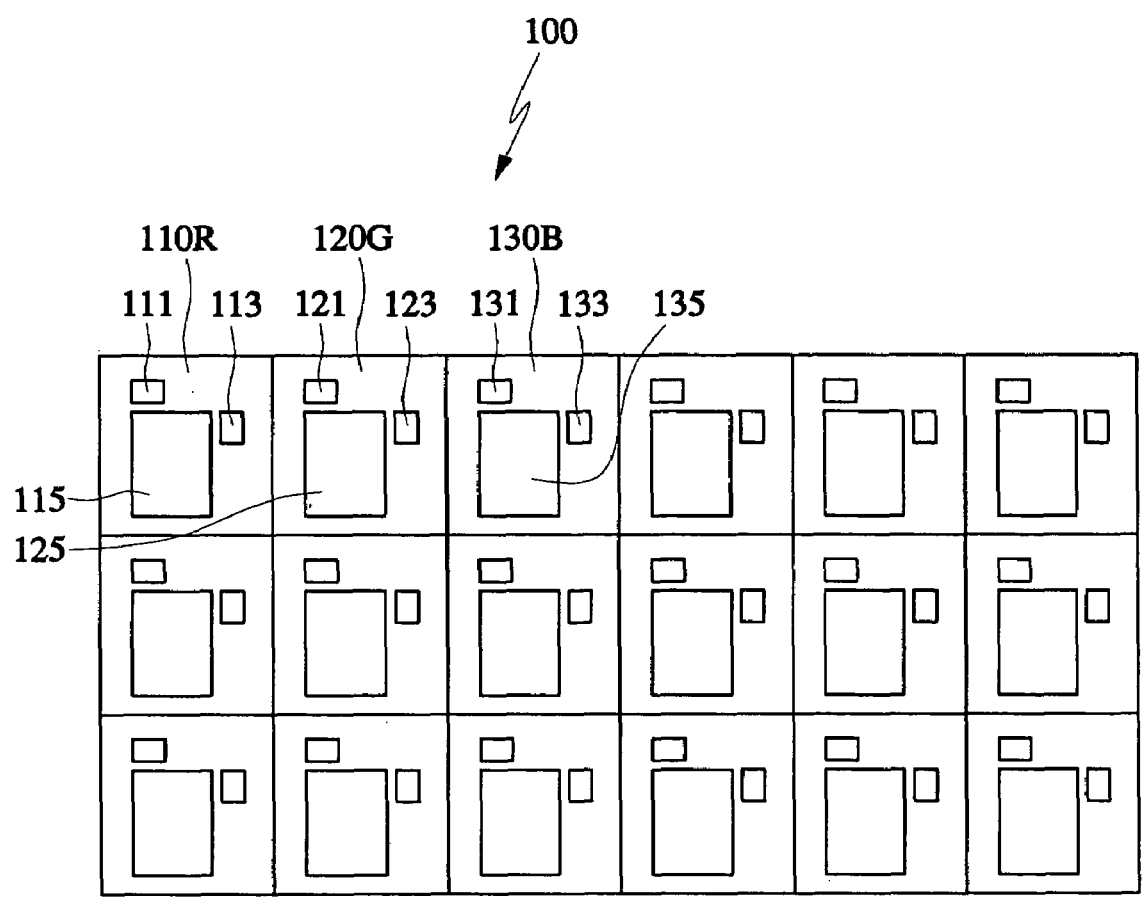
FIG. 1 is a view showing an arrangement of R, G and B unit pixels of a prior art flat panel display.

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2A:
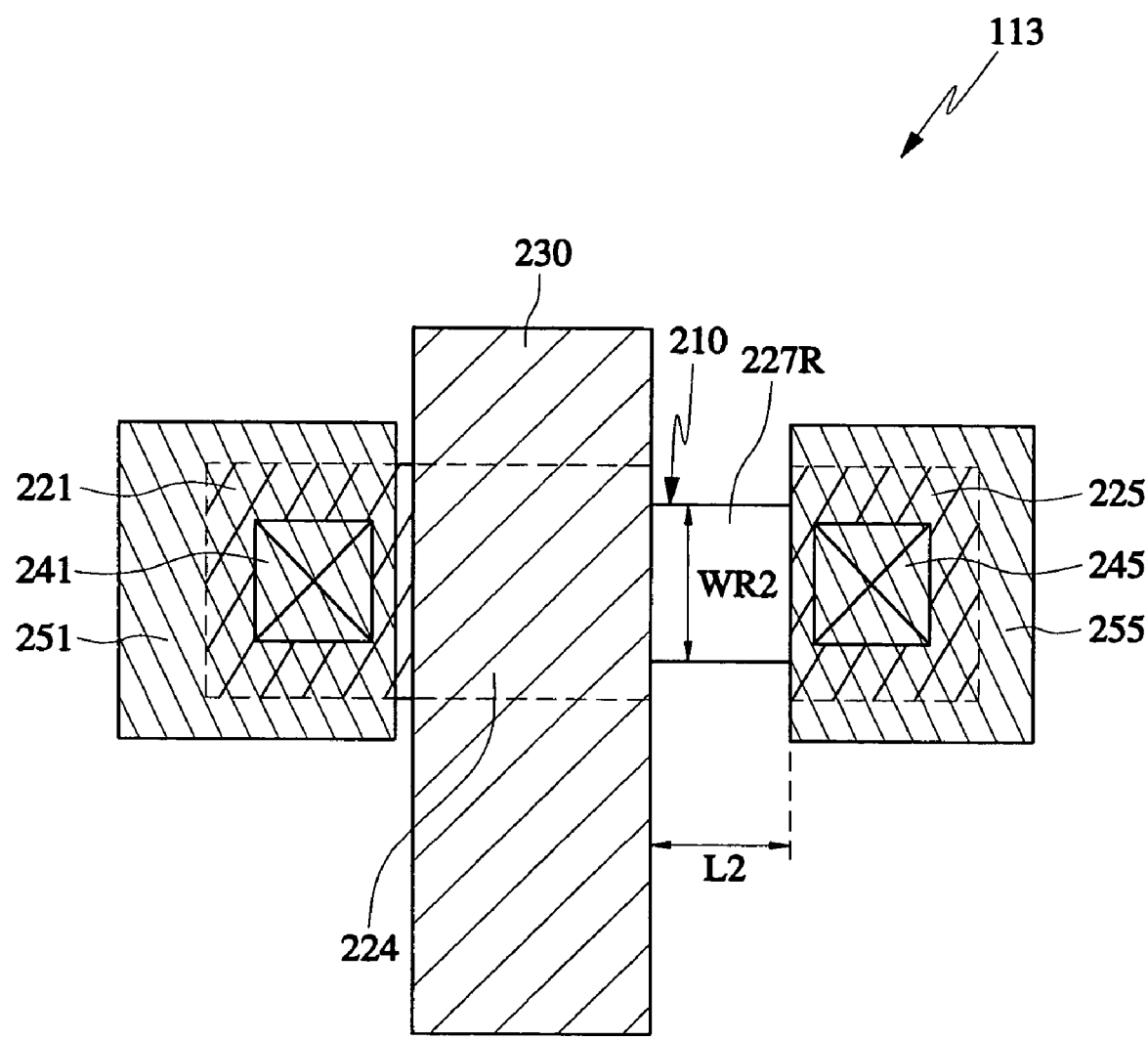
FIGS. 2A, 2B and 2C are plane views of driving transistors of R, G and B unit pixels in a flat panel display in accordance with a first embodiment of the present invention.
Figure 2B:
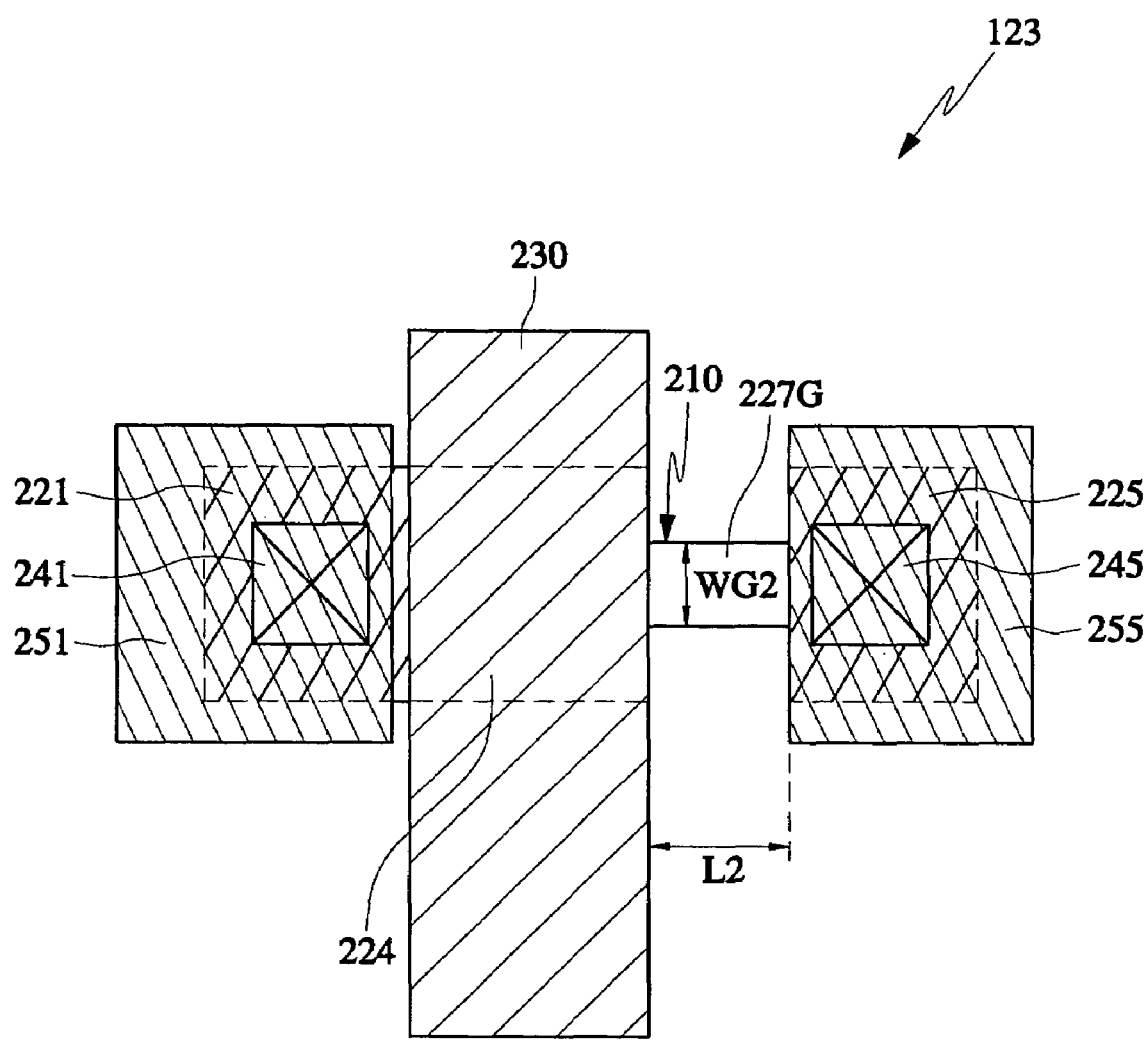
Figure 2C:
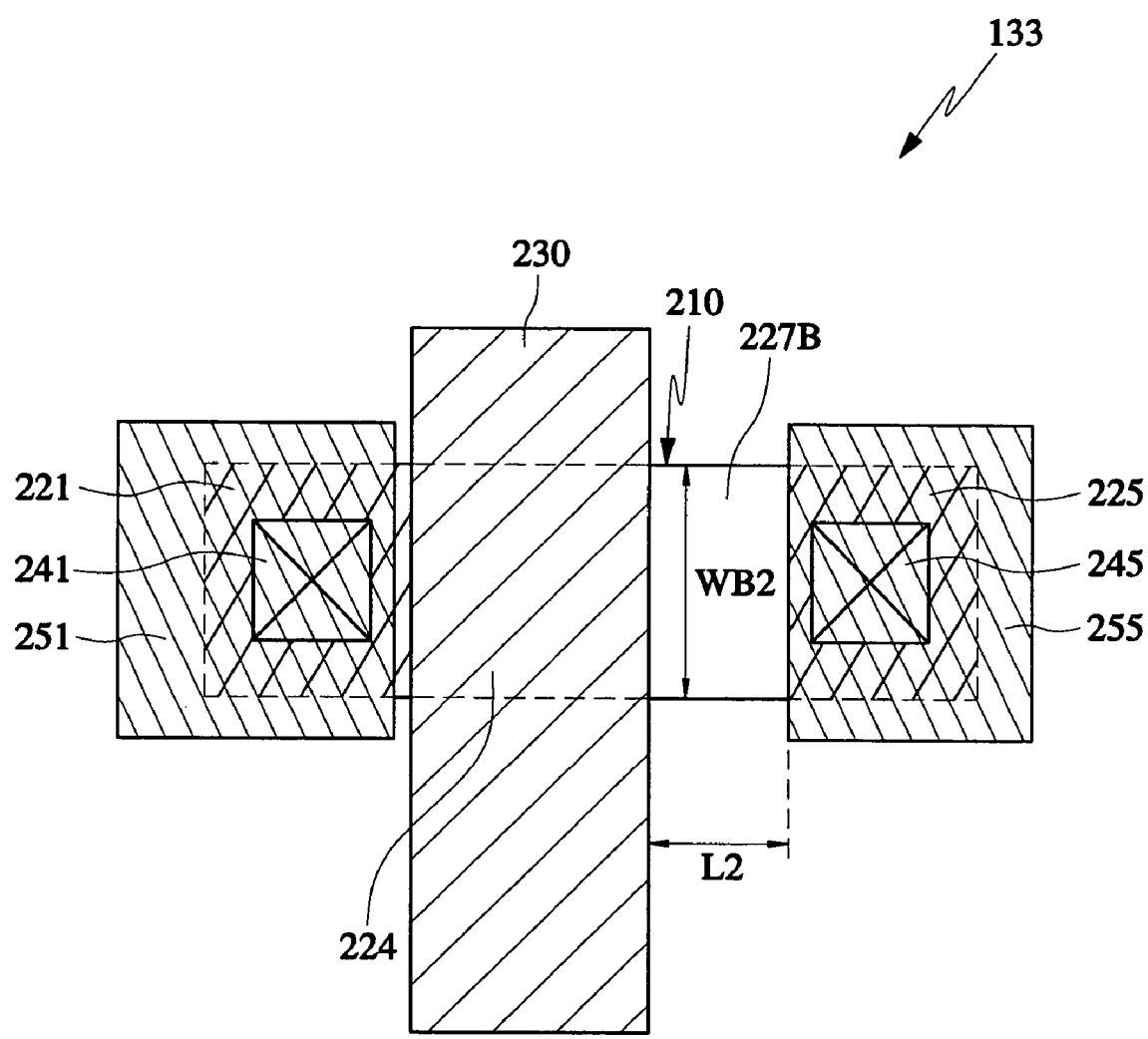

FIGS. 2A, 2B and 2C show plane structures of organic light emitting diodes in accordance with a first embodiment of the present invention, with each figure showing driving transistors of R, G and B unit pixels.

Referring to FIGS. 2A, 2B and 2C, the driving transistors 113, 123 and 133 of the R, G and B unit pixels in accordance with the first embodiment of the present invention each include a semiconductor layer 210, a gate 230 and source/drain electrodes 251 and 255. The semiconductor layer 210 includes a channel layer 224 formed on a part corresponding to the gate 230 and high concentration source/drain regions 221 and 225 formed at both sides of the channel layer 224. Here, the source/drain regions 221 and 225 are electrically connected to the source/drain electrodes 251 and 255 through contacts 241 and 245, respectively.

As for the driving transistors 113, 123 and 133 of the R, G and B unit pixels, the semiconductor layers 210 of each further include offset regions 227R, 227G and 227B formed between the channel layer 224 and the drain region 225, respectively. Even though the offset regions 227R, 227G and 227B have the same length of L2, the widths of the regions are different in accordance with the luminous efficiency. That is, the width WR2 of the driving transistor 113 of the R unit pixel is wider than the width WG2 of the driving transistor 123 of the G unit pixel having the highest luminous efficiency, and the width WR2 is narrower than the width WB2 of the driving transistor 133 of the B unit pixel having the lowest luminous efficiency.

Figure 3A:
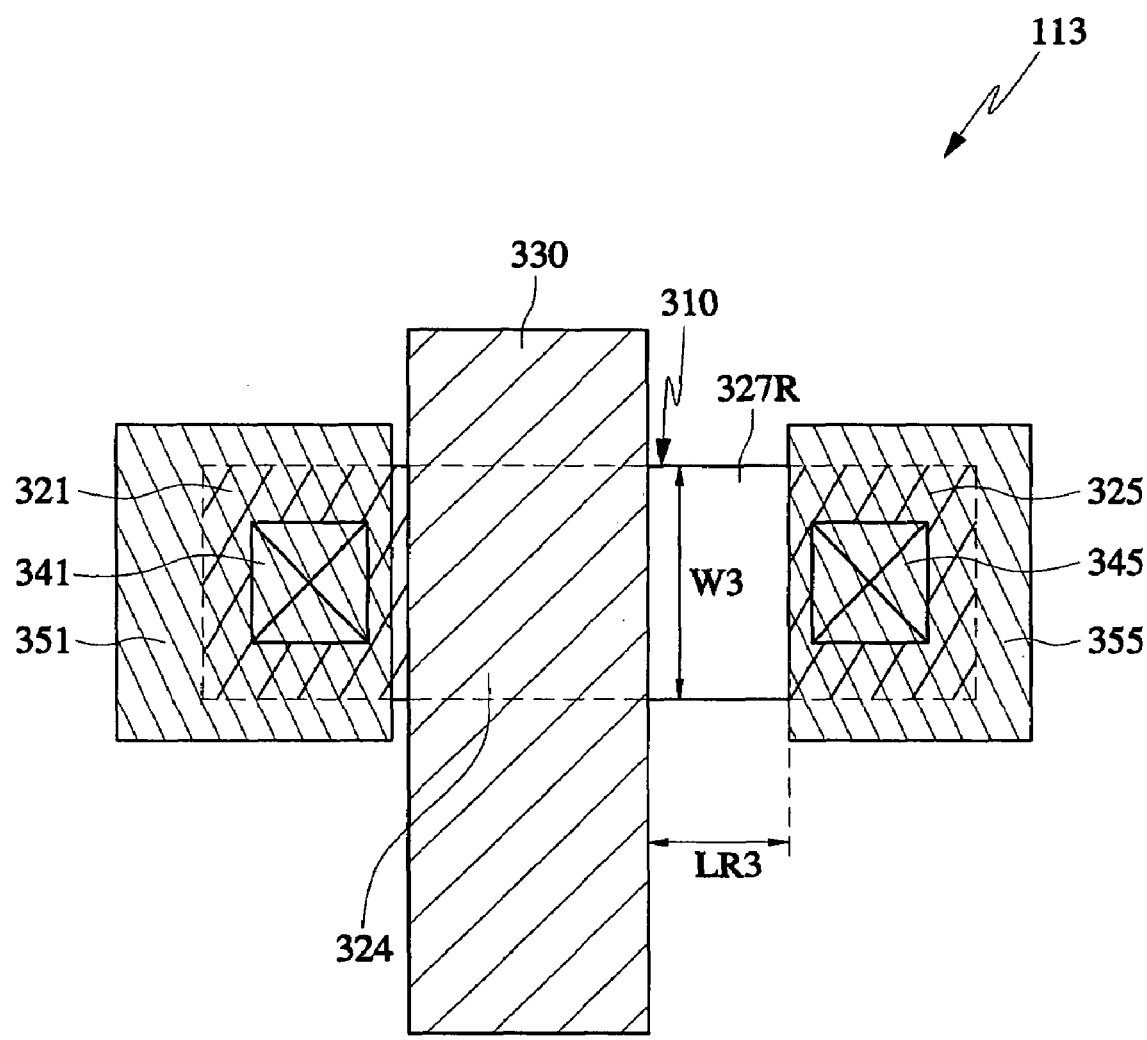
FIGS. 3A, 3B and 3C are plane views of driving transistors of R, G and B unit pixel in a flat panel display in accordance with a second embodiment of the present invention.
Figure 3B:
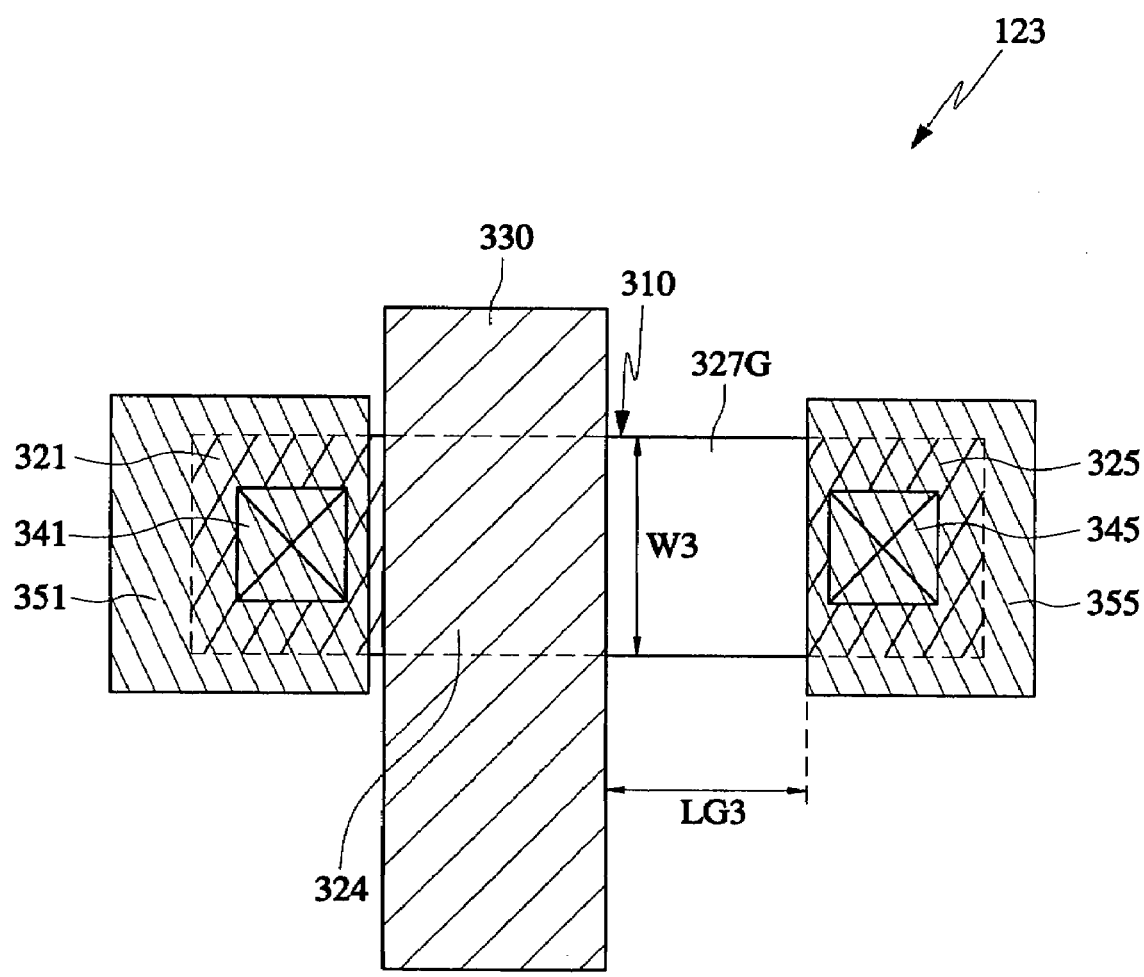
Figure 3C:
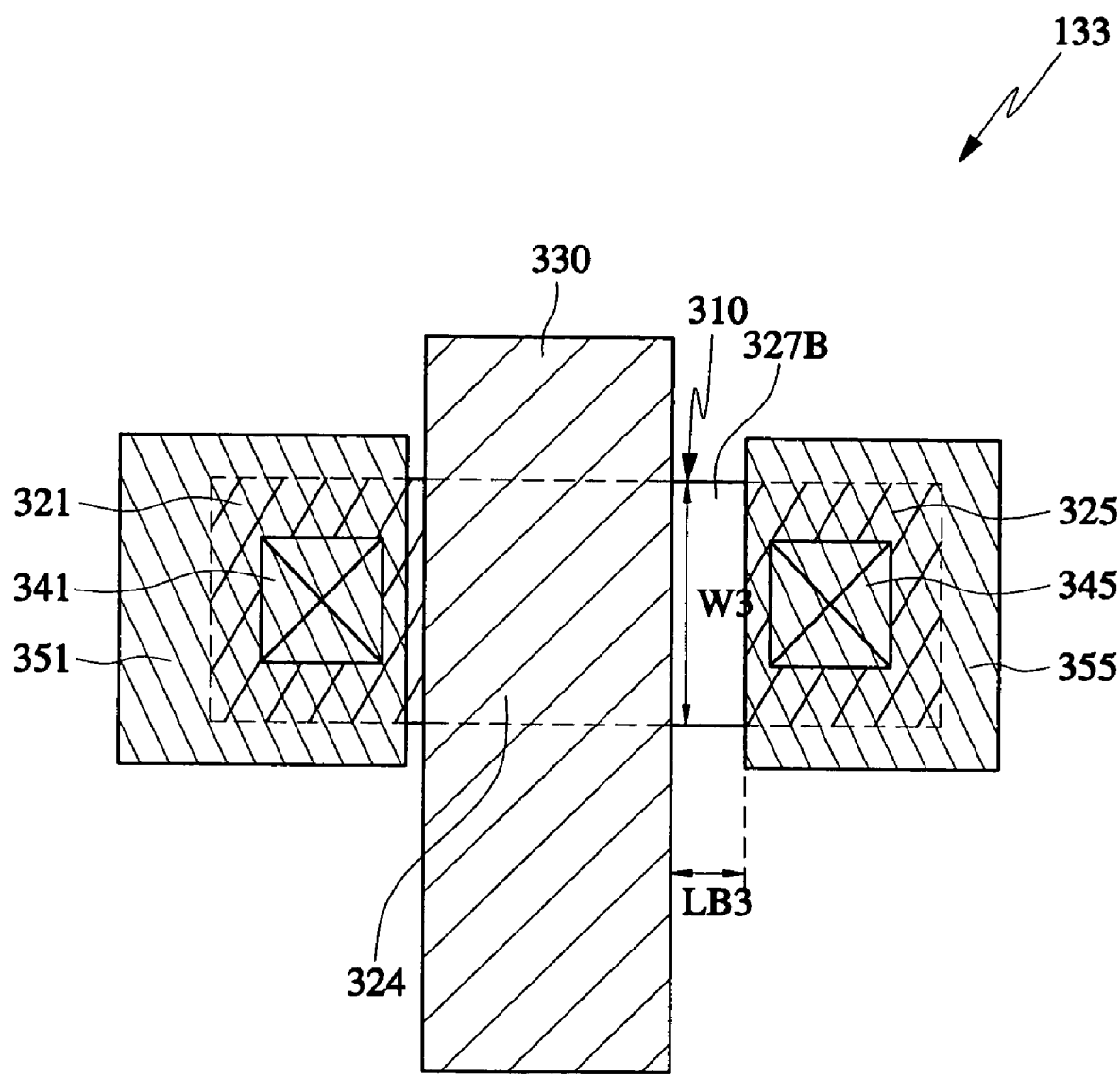

FIGS. 3A, 3B and 3C are views showing plane structures of an organic light emitting diode in accordance with a second embodiment of the present invention, with each figure showing driving transistors of the R, G and B unit pixels, respectively.

Referring to FIGS. 3A, 3B and 3c, driving transistors 113, 123 and 133 of the R, G and B unit pixels in accordance with the second embodiment of the present invention each include a semiconductor layer 310, a gate 330 and source/drain electrode 351 and 355. The semiconductor layer 310 includes a channel layer 324 formed on a part corresponding to the gate 330 and high concentration regions 321 and 325 formed at both sides of the channel layer 324. The source/drain regions 321 and 325 are electrically connected to the source/drain electrodes 351 and 355 through contacts 341 and 345, respectively.

As for driving transistors 113, 123 and 133 of each R, G and B unit pixel, the semiconductor layer 310 of each further include offset regions 327R, 327G and 327B formed between the channel layer 324 and the drain region 325. Even though widths W3 of the offset regions 327R, 327G and 327B are the same, lengths of them are different in accordance with the luminous efficiency.

That is, the length LR3 of the driving transistor 113 of the R unit pixel is shorter than the length LG3 of the driving transistor 123 of the G unit pixel having the highest luminous efficiency and the length LR3 is longer than the length LB3 of the driving transistor 133 of the B unit pixel having the lowest luminous efficiency.

As described above, the present invention can embody the white balance by making sizes of the drain offset regions of the driving transistors of the R, G and B unit pixels different and changing the resistances.

Figure 4A:
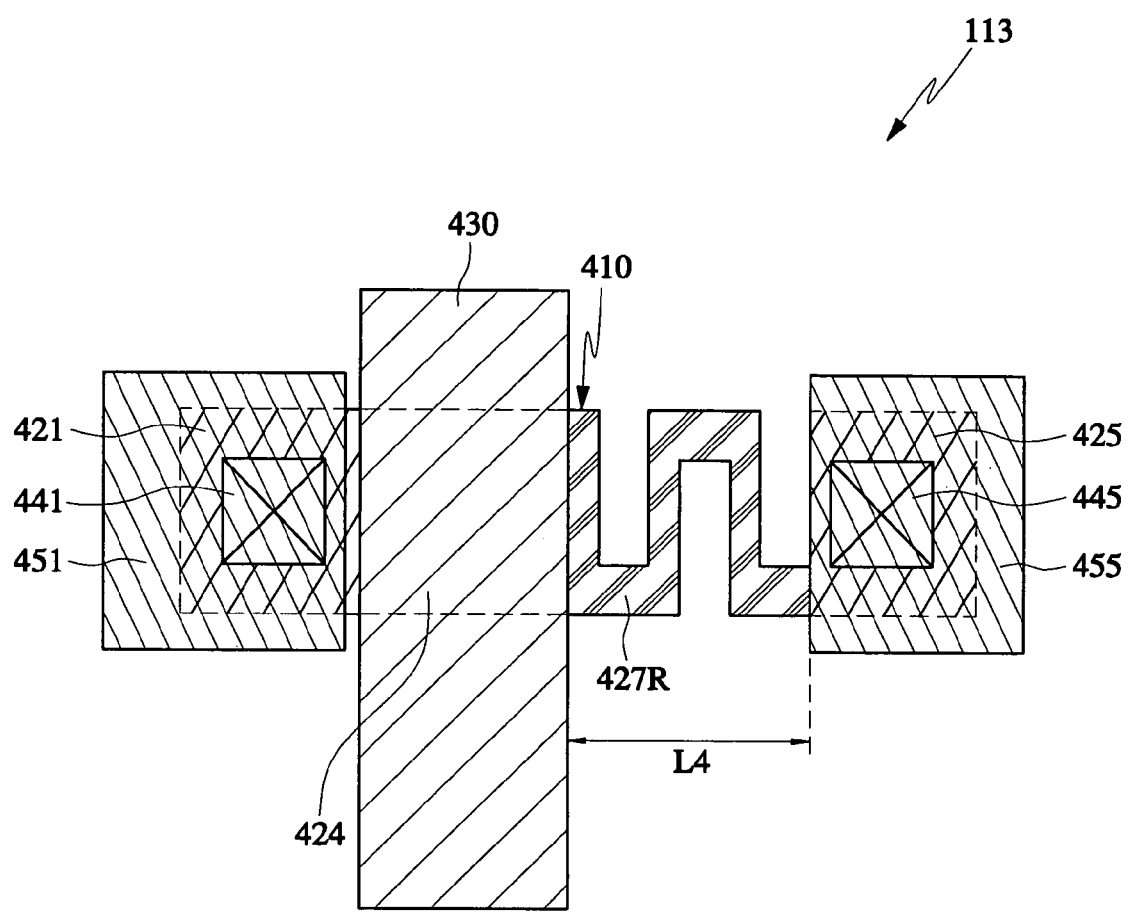
FIGS. 4A, 4B and 4C are plane views of driving transistors of R, G and B unit pixels in a flat panel display in accordance with a third embodiment of the present invention.
Figure 4B:
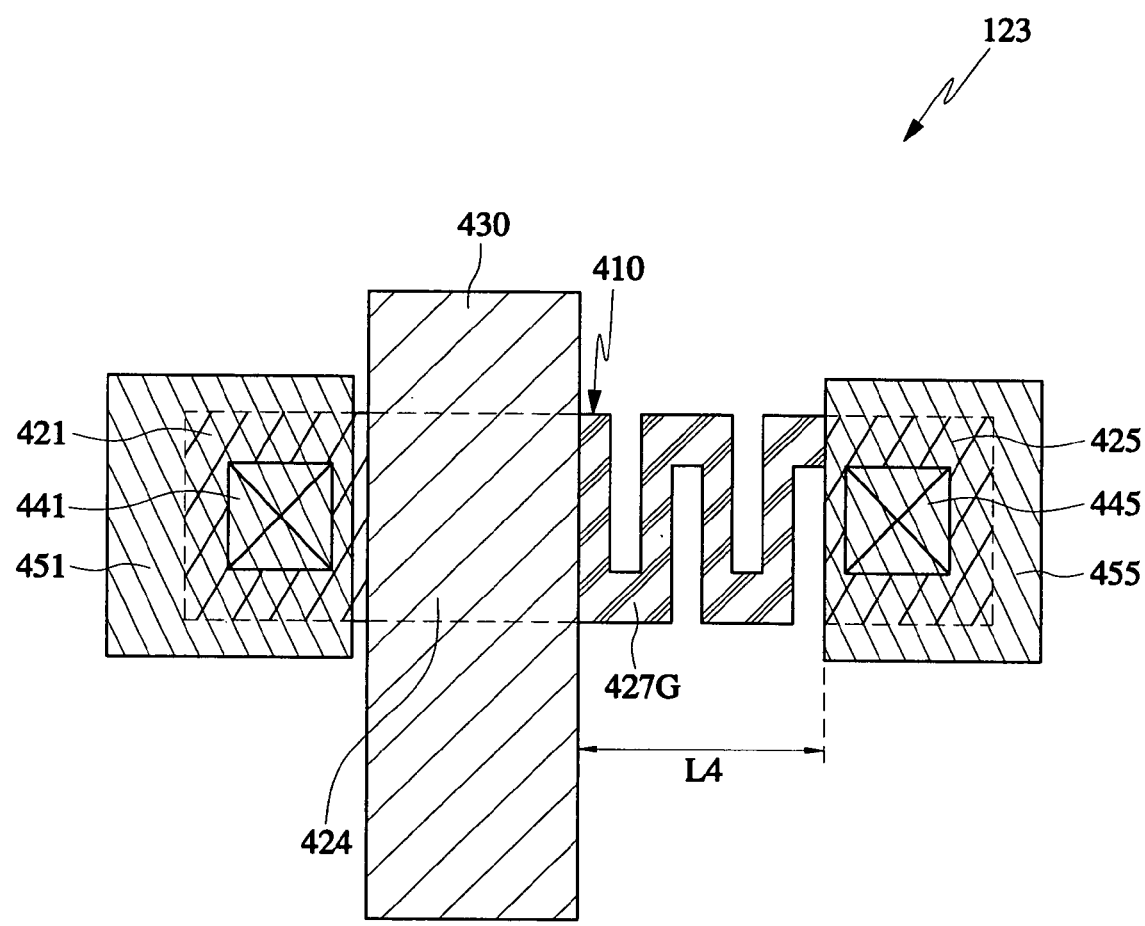
Figure 4C:
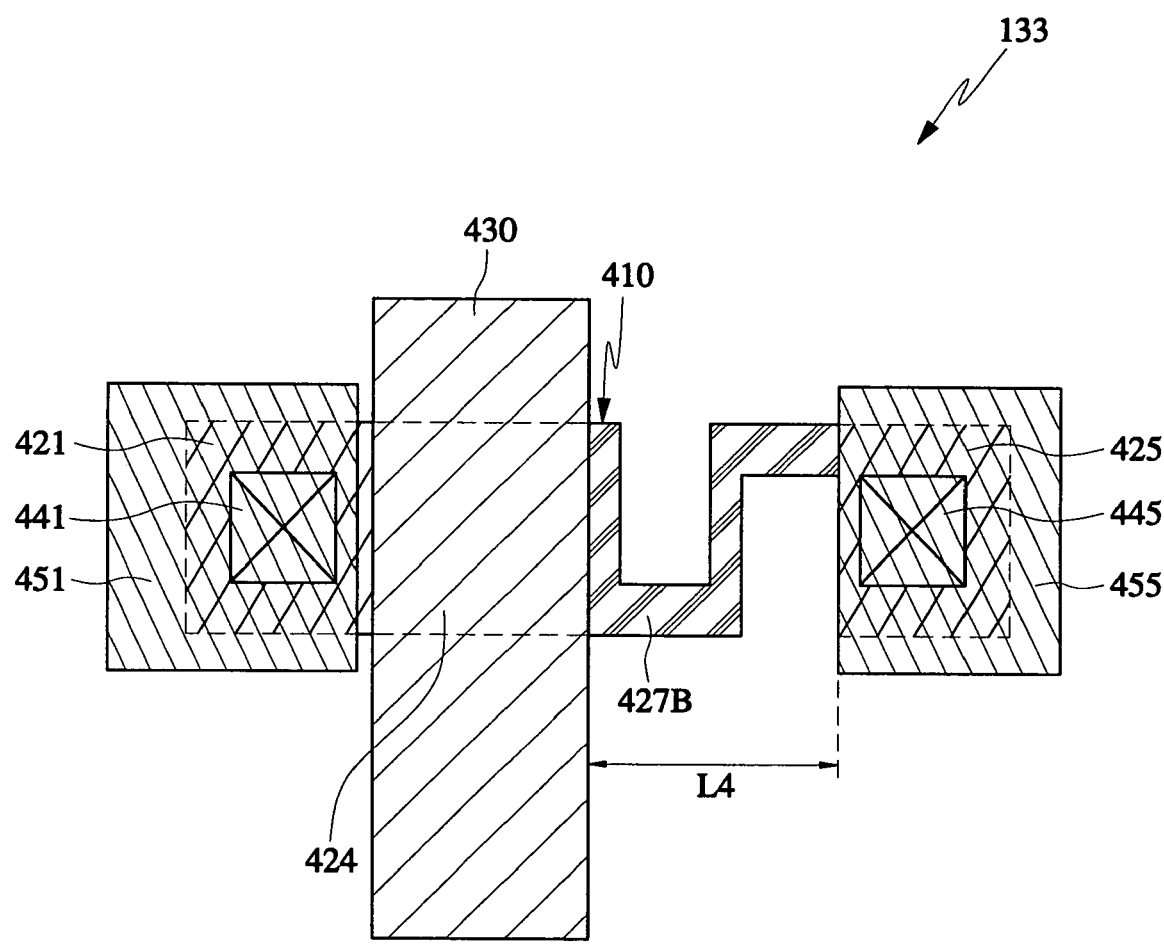

FIGS. 4A, 4B and 4C are views showing plane structures of an organic light emitting diode in accordance with a third embodiment of the present invention, with each figure showing driving transistors of R, G and B unit pixels, respectively.

Referring to FIGS. 4A, 4B and 4C, the driving transistors 113, 123 and 133 of the R, G and B unit pixels in accordance with the third embodiment of the present invention each include a semiconductor layer 410, a gate 430 and source/drain electrodes 451 and 455. The semiconductor layer 410 includes a channel layer 424 formed on a part corresponding to the gate 430, and high concentration source/drain regions 421 and 425 formed at both sides of the channel layer 424. The source/drain regions 421 and 425 are electrically connected to the source/drain electrodes 451 and 455 through contacts 441 and 445, respectively.

As for driving transistors 113, 123 and 133 of each R, G and B unit pixel, the semiconductor layer 410 of each further include offset regions 427R, 427G and 427B formed between the channel layer 424 and the drain region 425. The offset regions 427R, 427G and 427B are formed to have different geometric shapes in a predetermined space L4 between the drain region 425 and the channel region 424. The offset regions 427R, 427G and 427B are formed to have geometric structures of zigzag forms having different lengths in accordance with the luminous efficiency. That is, the offset regions 427R, 427G and 427B of the driving transistors 113, 123, 133 have a zigzag shape so that the length of the driving transistor 113 of the R unit pixel is shorter than the length of the driving transistor 123 of the G unit pixel having the highest luminous efficiency and the length of the driving transistor 113 of the R unit pixel is longer than the length of the driving transistor 133 of the B unit pixel having the lowest luminous efficiency. While the offset regions are shown to have a zigzag shape, it is understood that other geometric shapes may also be used.

In the third embodiment of the present invention, the white balance can be embodied by making shapes of the drain offset regions of the driving transistors of the R, G and B unit pixels different and changing the resistances.

In the embodiment of the present invention, the offset regions are formed in the drain regions of all driving transistors of the R, G and B unit pixels. However, it may be possible that the drain offset region is not formed in the B unit pixel having the lowest luminous efficiency and the drain offset regions of geometric shapes having different resistance values are formed in the R and G unit pixels only.

In the embodiment of the present invention, the offset region of the drain has a shape of zigzag. However, all geometric shapes of the offset regions of the R, G and B unit pixels having differences in the resistance value in order to embody the white balance are applicable.

Even though the offset regions are formed in the drain regions in the embodiment of the present invention, the offset regions may be also formed in the source regions.

Figure 5A:
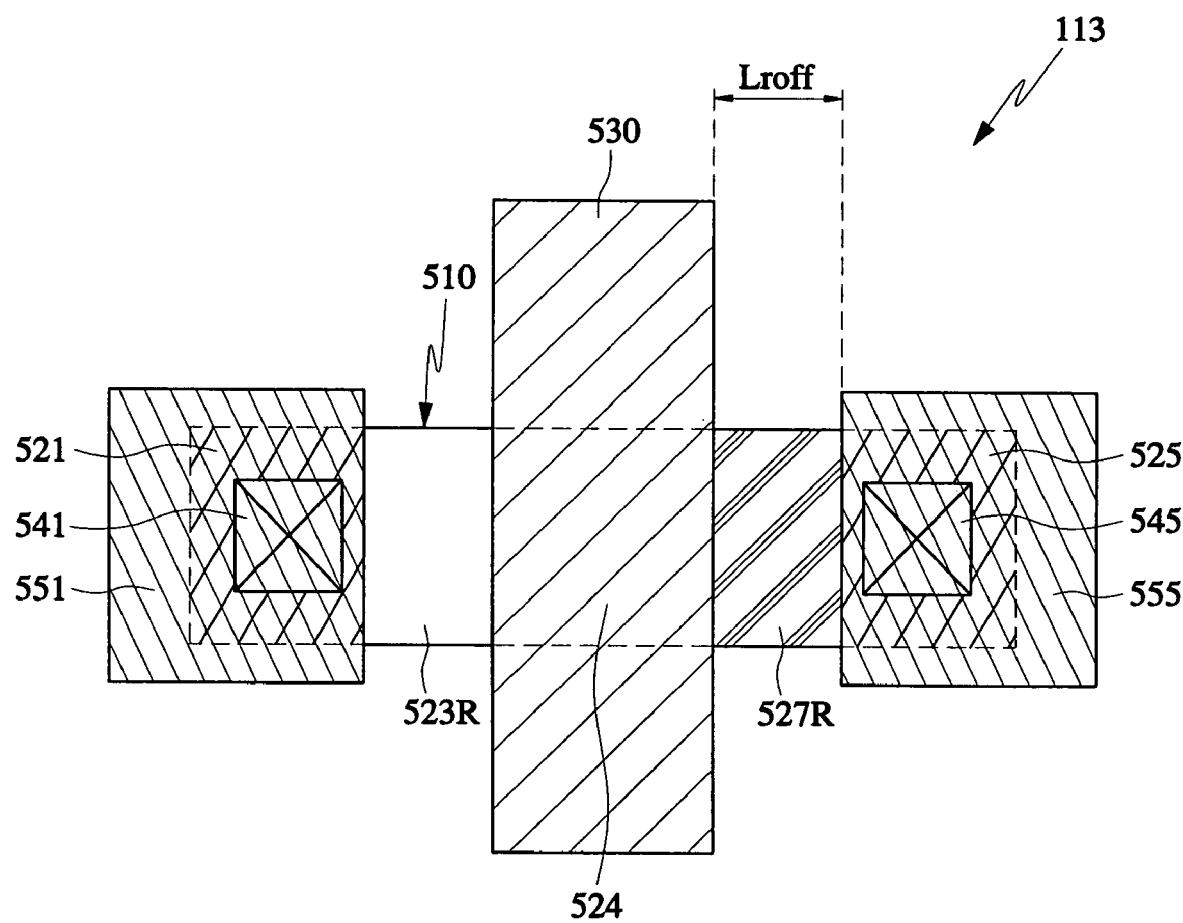
FIGS. 5A, 5B and 5C are plane views of driving transistors of R, G and B unit pixel in a flat panel display in accordance with a fourth embodiment of the present invention.
Figure 5B:
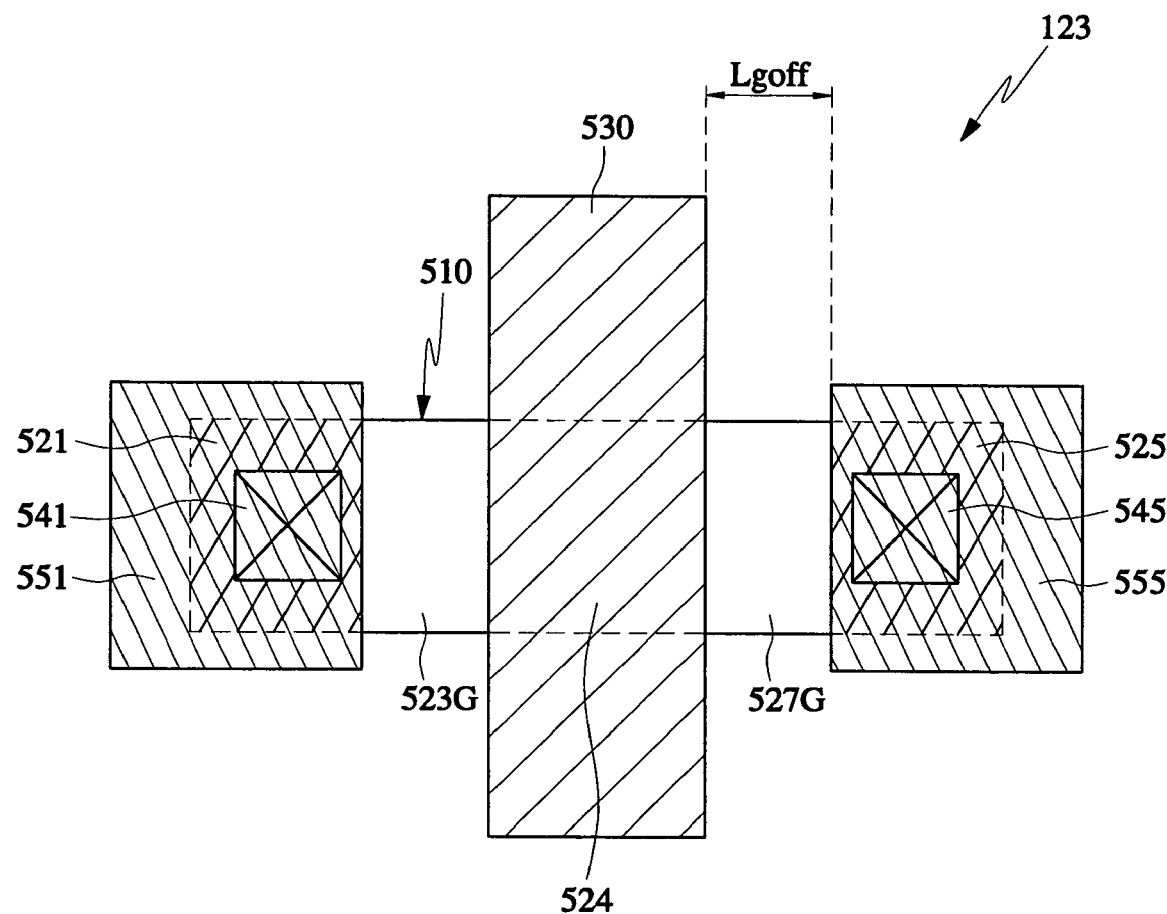
Figure 5C:
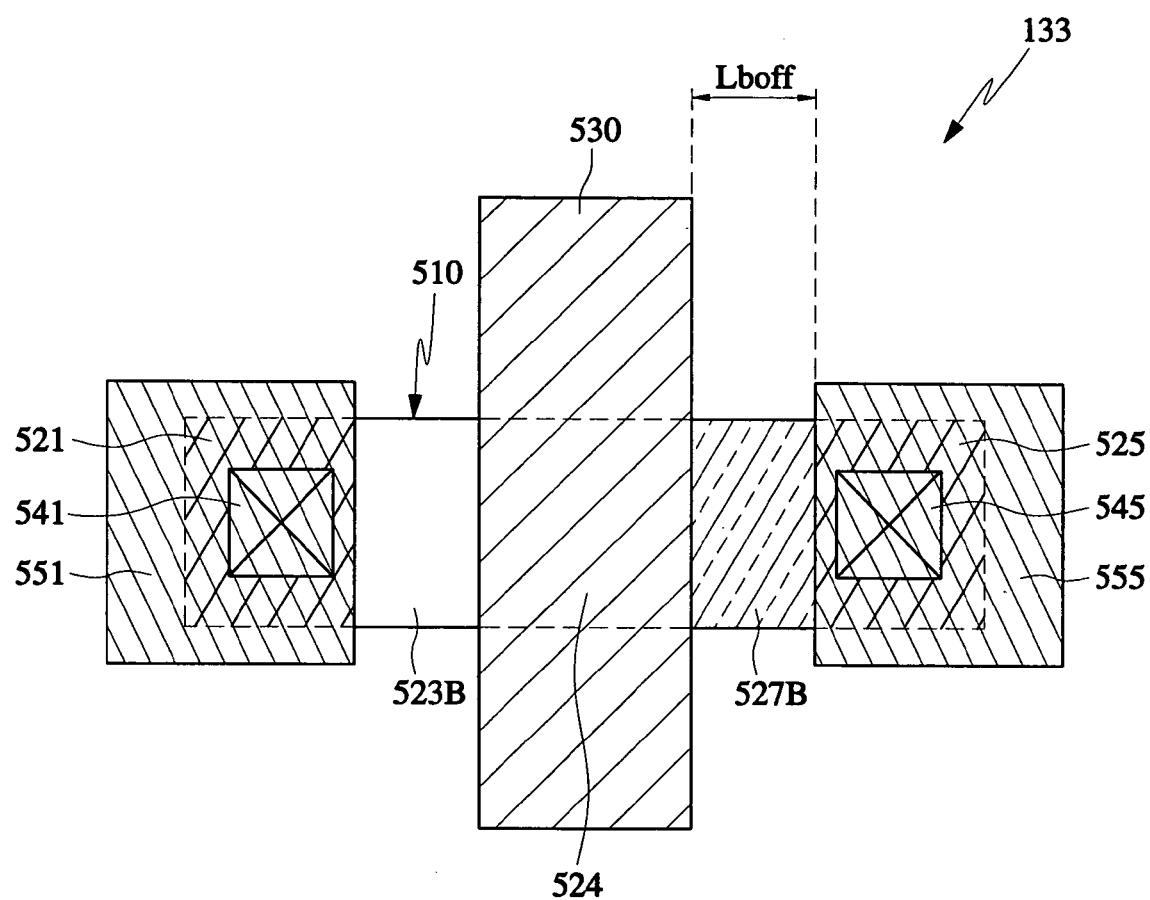

FIGS. 5A, 5B and 5C are views showing plane structures of organic light emitting diodes in accordance with a fourth embodiment of the present invention, with each figure showing driving transistors of R, G and B unit pixels.

Referring to FIGS. 5A, 5B and 5C, the driving transistors 113, 123 and 133 of the R, G and B unit pixels in accordance with the fourth embodiment of the present invention each include a semiconductor layer 510, a gate 530 and source/drain electrodes 551 and 555. The semiconductor layers 510 each include a channel layer 524 formed on a part corresponding to the gate 530, and high concentration source/drain regions 521 and 525 formed at both sides of the channel layer 524. The source/drain regions 521 and 525 are electrically connected to the source/drain electrodes 551 and 555 through contacts 541 and 545, respectively.

In the driving transistors 113, 123 and 133 of the R, G and B unit pixel, the semiconductor layers 510 of each further include offset regions 523R, 523G and 523B formed between the channel layer 524 and the source region 521, and offset regions 527R, 527G and 527B formed between the channel layer 524 and the drain region 525.

In the driving transistor 113 of the R unit pixel, the source offset region 523R of the offset regions 523R and 527R is an intrinsic region where no impurities are doped and the drain offset region 527R is a region where impurities of relatively low concentration which have the same conductivity type with the source/drain regions 521 and 525, are doped.

In the driving transistor 123 of the G unit pixel, the offset regions 523G and 527G are both intrinsic regions where no impurities are doped. Also, in the driving transistor 133 of the B unit pixel, the source offset region 523B of the offset regions 523B and 527B is an intrinsic region where no impurities are doped, and the drain offset region 527B is a region which has the same conductivity type with the source/drain regions 521 and 525 and is doped with impurities having higher concentration higher than that of the drain offset region 527R of the R unit pixel.

In the fourth embodiment of the present invention, the white balance is embodied by forming driving transistors of R, G and B unit pixels having different light emitting efficiencies with the same size, making the lengths of the drain offset regions Lroff, Lgoff and Lboff the same, and making the drain offset regions have different resistance values according to the doping concentration.

That is, since the R and B unit pixels have light emitting efficiencies lower than that of the G unit pixel, the drain offset region 527G of the G unit pixel having a relatively high luminous efficiency is not doped so that the drain offset region 527G is formed to have a relatively high resistance value. The drain offset region 527B of the B unit pixel having the lowest luminous efficiency is doped with a relatively high concentration so that it is formed to have a relatively low resistance value. The drain offset region 527R of the R unit pixel having luminous efficiency between those of the G unit pixel and the B unit pixel is doped with a doping concentration lower than that of offset region 527B of the B unit pixel so that the drain offset region 527R is formed to have a resistance value between those of the G unit pixel and the B unit pixel.

In the fourth embodiment of the present invention, even though an offset region not doped with impurity is formed in the source, it may be possible that the source offset region of the R unit pixel is doped with a relatively low concentration and the source offset region of the B unit pixel is doped with as high a concentration as is in the drain offset region. Also, the offset region may be formed in the part of the drain.

Even though the drain offset region is not doped in the G unit pixel and the drain regions of the R and B unit pixels are doped with the low and high concentrations respectively, it may also be possible that the drain offset regions of the R, G and B unit pixels are differently doped with one another in order that the difference of the resistance values of drain regions to embody the white balance is generated.

In the first to fourth embodiments of the present invention, the white balance can be embodied by changing a doping concentration or shape and size of the drain region without changing the size of the channel layers of the driving transistors of the R, G and B unit pixels.

In accordance with the embodiments of the present invention, the white balance can be embodied, that is, an improved white balance may be achieved, by changing the doping concentrations of the drain offset regions of the R, G and B unit pixels and then changing the resistance value of the drain region without increasing the pixel area which is occupied by each unit pixel.

Also, the white balance can be embodied by making the drain offset regions of the R, G and B unit pixels have geometric structures having different shapes and sizes (W/L) and thus have different resistance values of the drain region without increasing the pixel area.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flat panel display, comprising:
   a plurality of pixels, each of the plurality of pixels including R, G and B unit pixels to embody red (R), green (G) and blue (B) colors, respectively, each of unit pixels including a transistor with source/drain regions,
   wherein transistors of at least two unit pixels of the R, G and B unit pixels have drain regions of different geometric structures, and
   wherein the drain regions of the transistors of the R, G and B unit pixels are of zigzag shapes.

2. The flat panel display according to claim 1, wherein each unit pixel further includes a light emitting device driven by the transistor, and the drain region of a transistor to drive the light emitting device having the highest luminous efficiency of the light emitting devices among the transistors in the unit pixels has a longer length compared with lengths of drain regions of transistors to drive light emitting devices having a relatively lower luminous efficiency.

3. The flat panel display according to claim 1, wherein the drain regions of the transistors of the R, G and B unit pixels include offset regions having different geometric structures from one another, respectively.

4. The flat panel display according to claim 3, wherein each unit pixel further includes a light-emitting device driven by the transistor, and the drain offset region of the transistor to drive the light emitting device having the highest luminous efficiency among the transistors in the unit pixels has a longer length, in comparison with lengths of drain offset regions of transistors to drive light emitting devices having a relatively low luminous efficiency.

5. The flat panel display according to claim 3, wherein the drain offset regions of the transistors of the R, G and B unit pixels are of zigzag shapes.

6. The flat panel display according to claim 1, wherein the unit pixels further include light-emitting devices, respectively, and channel layers of the transistors controlling currents supplied to the light emitting devices of the unit pixels are of same size.

7. A flat panel display, comprising:
a plurality of pixels, each of the plurality of pixels including R, G and B unit pixels to embody red (R), green (G) and blue (B) colors, respectively, each of unit pixels including a transistor with source/drain regions,
wherein transistors of at least two unit pixels of the R, G and B unit pixels have drain regions of different geometric structures, and
wherein the drain regions of the transistors of the R, G and B unit pixels are of a construction having a same width and a different length from one another.

8. The flat panel display according to claim 7, wherein each unit pixel further includes a light emitting device driven by the transistor, and the drain region of a transistor to drive the light emitting device having the highest luminous efficiency of the light emitting devices among the transistors in the unit pixels has a longer length compared with lengths of drain regions of transistors to drive light emitting devices having a relatively lower luminous efficiency.

9. The flat panel display according to claim 7, wherein the drain regions of the transistors of the R, G and B unit pixels include offset regions having different geometric structures from one another, respectively.

10. The flat panel display according to claim 9, wherein each unit pixel further includes a light-emitting device driven by the transistor, and the drain offset region of the transistor to drive the light emitting device having the highest luminous efficiency among the transistors in the unit pixels has a longer length in comparison with lengths of drain offset regions of transistors to drive light emitting devices having a relatively low luminous efficiency.

11. The flat panel display according to claim 9, wherein the drain regions of the transistors of the R, G and B unit pixels include offset regions having a same width and a different length from one another.

12. The flat panel display according to claim 7, wherein the unit pixels further include light-emitting devices, respectively, and channel layers of the transistors controlling currents supplied to the light emitting devices of the unit pixels are of same size.

13. A flat panel display, comprising:
a plurality of pixels, each of the plurality of pixels including R, G and B unit pixels to embody red (R), green (G) and blue (B) colors, respectively, each of unit pixels including a transistor with source/drain regions,
wherein transistors of at least two unit pixels of the R, G and B unit pixels have drain regions of different geometric structures, and
wherein the drain regions of the transistors of the R, G and B unit pixels include offset regions having a same length and a different width from one another.

14. The flat panel display according to claim 13, wherein each unit pixel further includes a light-emitting device driven by the transistor, and the drain offset region of the transistor to drive the light emitting device having the highest luminous efficiency among the transistors in the unit pixels has a narrower width in comparison with widths of drain offset regions of transistors to drive light emitting devices having a relatively low luminous efficiency.

15. The flat panel display according to claim 13, wherein the unit pixels further include light-emitting devices, respectively, and channel layers of the transistors controlling currents supplied to the light emitting devices of the unit pixels are of same size.

* * * * *